United States Patent [19]

Matsui et al.

[11] Patent Number: 5,717,359
[45] Date of Patent: Feb. 10, 1998

[54] SEMICONDUCTOR INTEGRATED CIRCUIT HAVING ELONGATED FIXED POTENTIAL LINES TO REDUCE NOISE ON THE LINES

[75] Inventors: Hideo Matsui; Takatsugu Kitora, both of Itami, Japan

[73] Assignee: Mitsubishi Denki Kabushiki Kaisha, Tokyo, Japan

[21] Appl. No.: 527,676

[22] Filed: Sep. 12, 1995

[30] Foreign Application Priority Data

Apr. 14, 1995 [JP] Japan ................... 7-089700

[51] Int. Cl.⁶ .................................. H01L 25/00
[52] U.S. Cl. .................. 327/565; 327/382; 333/12; 333/156
[58] Field of Search ................... 327/382, 565; 333/12, 156, 161

[56] References Cited

U.S. PATENT DOCUMENTS

| | | | |
|---|---|---|---|
| 4,935,710 | 6/1990 | Yamazaki et al. | 333/12 |
| 4,949,057 | 8/1990 | Ishizaka et al. | 333/156 |
| 5,187,455 | 2/1993 | Mandai et al. | 333/156 |
| 5,315,182 | 5/1994 | Sakashita et al. | 327/563 |
| 5,339,056 | 8/1994 | Kanako et al. | 333/156 |
| 5,521,568 | 5/1996 | Wu et al. | 333/161 |

FOREIGN PATENT DOCUMENTS

| | | |
|---|---|---|
| 60-231355 | 11/1985 | Japan . |
| 61-239649 | 10/1986 | Japan . |
| 62-42553 | 2/1987 | Japan . |
| 64-57746 | 3/1989 | Japan . |
| 376142 | 4/1991 | Japan . |
| 4-260341 | 9/1992 | Japan . |
| 6-104720 | 4/1994 | Japan . |

*Primary Examiner*—Timothy P. Callahan
*Assistant Examiner*—Jung Ho Kim
*Attorney, Agent, or Firm*—Lowe, Price, LeBlanc & Becker

[57] ABSTRACT

In a semiconductor integrated circuit device of the invention, a fixed potential line is extended longer than required on the semiconductor integrated circuit device, so that a parasitic inductance of the fixed potential line is increased, and accordingly an LC filter (low pass filter) operates to absorb high frequency noises.

10 Claims, 14 Drawing Sheets

SEMICONDUCTOR INTEGRATED CIRCUIT HAVING ELONGATED FIXED POTENTIAL LINES TO REDUCE NOISE ON THE LINES

BACKGROUND OF THE INVENTION

1. Field of the Invention

The Invention relates to a semiconductor integrated circuit device improved to cope with electromagnetic interferences.

2. Description of Related Art

FIG. 1 is a diagram of an example of the configuration of a conventional semiconductor integrated circuit device. The semiconductor integrated circuit device is equipped with a circuit unit 5 including a CPU 5b, a bus 8 such as a data bus, an address bus or the like which is wired to surround the circuit unit 5, terminal pads 9 arranged in the periphery of the bus 8, an oscillator circuit 6 for generating pulses, and a clock generating circuit 7 for generating system clocks from the pulses fed from the oscillator circuit 6.

A power source terminal pad 2 and a ground terminal pad 4 are included in the terminal pads 9. A source line 1 starting from the source terminal pad 2 is connected to the circuit unit 5, oscillator circuit 6 and clock generating circuit 7. Meanwhile, a ground line 3 is connected from the ground terminal pad 4 to the circuit unit 5, oscillator circuit 6 and clock generating circuit 7.

FIG. 2 is an equivalent circuit diagram of the semiconductor integrated circuit device of FIG. 1. The circuit unit 5, oscillator circuit 6 and clock generating circuit 7 are connected in parallel between the source line 1 and ground line 3. A capacity C at each bar of this ladder circuit and each inductance L of the source line 1 and ground line 3 at both sides of the bar constitute an LC filter functioning as a low pass filter.

The source line 1 and ground line 3 are respectively so connected as to run minimum distances from the source terminal pad 2 and ground terminal pad 4 to the circuit unit 5, oscillator circuit 6 and clock generating circuit 7 in order to allow the semiconductor integrated circuit device to be laid out in a small area. In other words, the source line 1 and ground line 3 are made as short as possible, so that parasitic inductance components by routing the wiring are reduced.

In the semiconductor integrated circuit device as above, a potential between the source line 1 and ground line 3 is sometimes fluctuated by the noises from an AC power source. For preventing this inconvenience, generally, a bypass capacitor is inserted between the source terminal pad 2 and ground terminal pad 4 thereby to remove the noises from the power source. However, when the source terminal pad 2 is separated not smaller than a given distance from the ground terminal pad 4, a lead wire of the bypass capacitor is long and the inductance makes it difficult to fully remove the noises. Moreover, the noises from the AC power source cannot be sufficiently removed when the noises are large.

In the aforementioned cases, when the source line 1 and ground line 3 have small inductance components, the LC filter (low pass filter) constituted of the inductance components and parasitic capacity components between the source line 1 and ground line 3 is small in efficiency, with the result that EMS (electromagnetic susceptibility) is poorly exerted without the noises eliminated, and a functional circuit included in the circuit unit 5 may be erroneously driven.

The oscillator circuit 6 and clock generating circuit 7 consist of CMOS transistors. When an L-level potential is applied to a gate of the CMOS transistor, a P-channel MOS transistor having a source thereof connected to the source line 1 is conductive to keep a drain thereof in an H level. On the other hand, when a potential of an H level is applied to the gate of the CMOS transistor, an N-channel MOS transistor having a source thereof connected to the ground line 3 is ON to hold a drain thereof in an L level.

Since the drain of the P-channel MOS transistor and the drain of N-channel MOS transistor of the CMOS transistor are connected to each other, the P-channel MOS transistor and N-channel MOS transistor are simultaneously turned ON in the middle of a change in the input level of the CMOS transistor.

In consequence, a current is let to flow along a route from the source terminal pad 2→source line 1→P-channel MOS transistor→N-channel MOS transistor→ground line 3 to the ground terminal pad 4, and a feedthrough current runs between the source terminal pad 2 and ground terminal pad 4.

Since the feedthrough current runs an increased number of times in the oscillator circuit 6 and clock generating circuit 7 because the circuits 6 and 7 are driven at high velocity, an average amount of the feedthrough current is increased, thus greatly fluctuating the potential of the source line 1. In spite of this fact, however, parasitic inductances on the source line 1 are small and the LC filter is little effective as discussed above. As such, high frequency waves generated on the source line 1 as a result from the fluctuation cannot be absorbed during the transfer along the source line 1, but are transmitted to the source terminal pad 2 to cause undesired radiation, that is, EMI (electromagnetic interferences).

An actual example of the above mechanism hindering the absorption of noises will be explained below.

An parasitic inductance to an aluminum wiring is said to be approximately 0.1 nH per 100 μm. Therefore, when a wiring length of the source line 1 is 100 μm, an inductance parasitic on the source line 1 is 0.1 nH. At this time, when a capacity parasitic on the source line 1 is approximately 10 pF, the inductance and capacity added to the source line 1 are as represented in FIG. 3.

The inductance and capacity added to the source line 1 shown in FIG. 3 are expressed by an impedance $Z_L$ of inductance components which is connected in series to a noise generation source 100 having the other end thereof grounded, and an impedance $Z_C$ of capacity components which is connected in parallel to the noise generation source 100 and impedance $Z_L$, with having the other end thereof grounded. And they are equivalent to an LC filter having a connection point between the impedances $Z_L$ and $Z_C$ as an output terminal 101.

For instance, noting 100 MHz among frequency components generated from the noise generation source 100, the impedances $Z_L$, $Z_C$ are respectively expressed as follows:

$$Z_L = 2\pi f L = 2\pi \times 100 \times 10^6 \times 0.1 \times 10^{-9} = 0.063 (\Omega)$$

$$Z_C = 1/2\pi f C = 1/(2\pi \times 100 \times 10^6 \times 10 \times 10^{-12}) = 160 (\Omega)$$

Therefore, supposing, e.g., that 1 mV noises are brought out from the noise generation source 100, an amount of noises transmitted to the output terminal 101 is hardly attenuated as is clear from an equation:

$$Z_C/(Z_C + Z_L) \times 1 \text{ mV} = 0.99961 \text{ mV}$$

Since a frequency band in the vicinity of 100 MHz is used in tuners of TV receivers, when radiation noises in the frequency band of 100 MHz are generated, images on the TV receivers are disadvantageously disturbed, or the like undesirable problem is given rise to.

In the meantime, such semiconductor integrated circuits as follows are proposed to solve the above-described problems. Specifically, Japanese Patent Application Laid-Open No. 64-57746(1989) reveals a semiconductor integrated circuit wherein a coil is formed on a semiconductor substrate with the use of two or more layers of aluminum. A semiconductor integrated circuit of a complementary type disclosed in Japanese Patent Application Laid-Open No. 60-231355(1985) is provided with an internal source system for supplying electricity to an internal circuit, a peripheral source system for supplying electricity to a peripheral circuit and an attenuation means for feeding a voltage of the peripheral source system to the internal source system with attenuating a change of the voltage. On the other hand, a high-speed integrated circuit package discussed in Japanese Patent Application Laid-Open No. 61-239649(1986) is designed to connect between wirings where a high frequency signal propagates by a connecting part of small inductance components, while connecting between wirings for supply of electric power by means of a connecting part of large inductance components.

Further, Japanese Patent Application Laid-Open No. 4-260341(1992) describes a semiconductor integrated circuit device in which an internal connection end between a source lead and a ground lead is split to increase a mutual inductance of an internal and an external circuits. In a different arrangement of a semiconductor integrated circuit discussed in Japanese Patent Application Laid-Open No. 3-76142(1991), a layout pattern for a wiring layer exclusive for a source wiring and a ground wiring is formed to totally include an area occupied by a module cell. Japanese Patent Application Laid-Open No. 6-104720(1994) depicts a semiconductor integrated circuit device with a built-in constant voltage circuit.

SUMMARY OF THE INVENTION

The invention has been devised to solve the above-described problems and has for its object to provide a semiconductor integrated circuit device wherein a source line and a ground line having a routed part intended to increase a parasitic inductance thereof are disposed, thereby displaying superior properties against electromagnetic interferences caused by noises from an AC power source, noises by a feedthrough current in a CMOS transistor, and so on.

According to the invention, a fixed potential line is routed longer than required on the semiconductor integrated circuit device to increase a parasitic inductance thereof. The effect of a resulting LC filter (low pass filter) acts to absorb high frequency noises.

The semiconductor integrated circuit device of the invention is characterized in the fixed potential line which is led from a terminal pad of a fixed potential to a circuit unit and which has a part routed to increase the parasitic inductance. Owing to the fixed potential line in the above constitution, inductance components parasitic on the fixed potential line are increased, whereby the effect of the LC filter by the inductance components and capacity components is enhanced to make it possible to absorb noises form the AC power source, noises by the feedthrough current in the CMOS transistor, and so on.

The fixed potential line may be routed, e.g., not smaller than a quarter turn in the periphery of the circuit unit.

In a case where the fixed potential line running from the terminal pad of the fixed potential to an oscillator circuit has a part routed to increase the parasitic inductance, it is particularly effective to absorb noises caused by the feedthrough current of the CMOS transistor included in the oscillator circuit, in addition to the aforementioned effect.

Further, in a case where the fixed potential line from the terminal pad of the fixed potential to a clock generating circuit has a part routed to increase the parasitic inductance, not only the above effect is achieved, but noises due to the feedthrough current of the CMOS transistor included in the clock generating circuit or the like are absorbed.

The fixed potential line from the terminal pad of the fixed potential to the clock generating circuit may be passed through a circuit unit so as to increase the parasitic inductance.

In a semiconductor integrated circuit device of the invention, a first fixed potential line from a first terminal pad of a fixed potential to the clock generating circuit and a second fixed potential line from a second terminal pad of a fixed potential to the clock generating circuit are connected to the clock generating circuit while one potential line adjoins in parallel to the other potential line. Therefore, inductance components parasitic on the first and second fixed potential lines are increased, whereby the effect of the LC filter composed of the inductance components and capacity components is enhanced, so that noises from the AC power source, particularly, noises due to the feedthrough current of the CMOS transistor included in the clock generating circuit are absorbed.

Alternatively, the first fixed potential line from the first terminal pad of the fixed potential to the clock generating circuit and the second fixed potential line from the second terminal pad of the fixed potential to the clock generating circuit may be connected to the clock generating circuit in a state where at least a part longer than half the total length of one potential line is adjacent and parallel to the other potential line.

The above and further objects and features of the invention will more fully be apparent from the following detailed description with accompanying drawings.

DESCRIPTION OF THE PREFERRED EMBODIMENTS

The invention will be discussed in detail hereinbelow with reference to the accompanying drawings of preferred embodiments.

Embodiment 1

Figure 4:
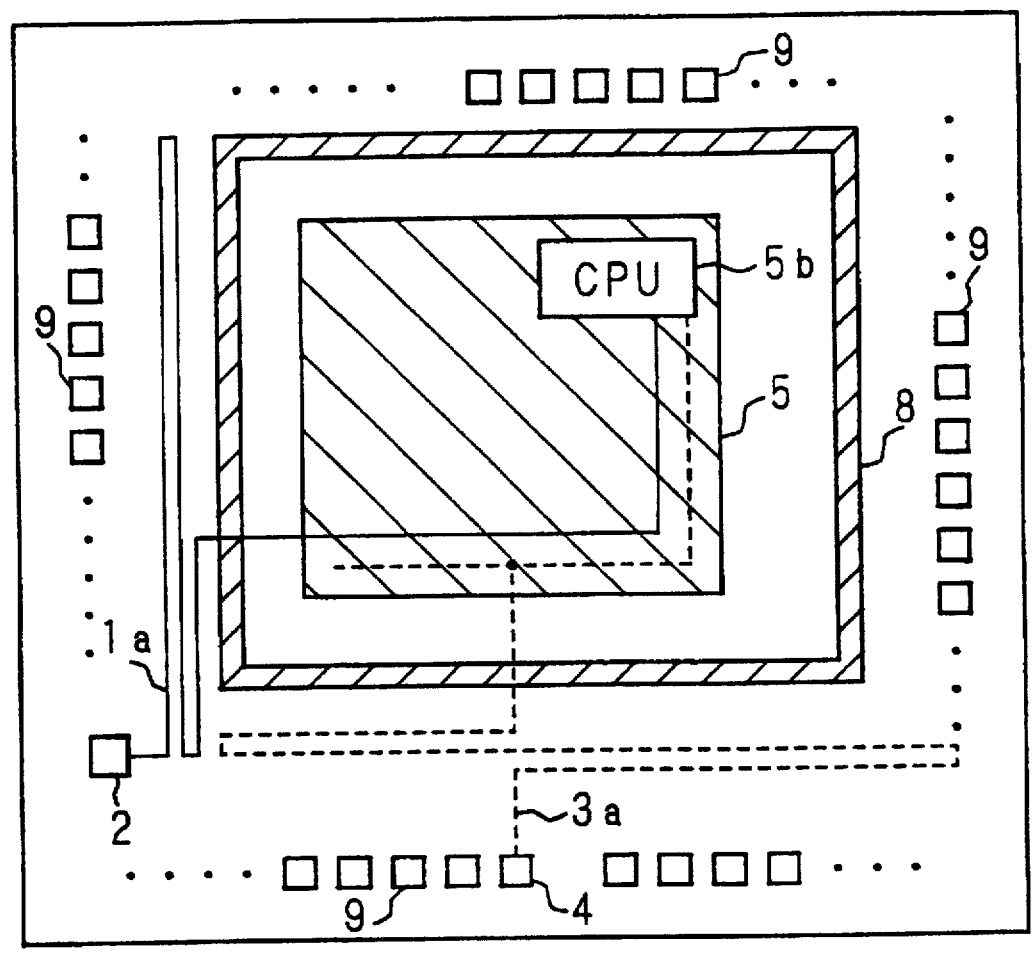
FIG. 4 is a diagram of the configuration of a semiconductor integrated circuit device according to a first embodiment of the invention.

FIG. 4 shows the configuration of a semiconductor integrated circuit device according to a first embodiment of the invention. The semiconductor integrated circuit device is provided with a circuit unit 5 including a CPU 5b, a bus 8 such as a data bus, an address bus and the like laid out to surround the circuit unit 5, and terminal pads 9 disposed outside the bus 8.

The terminal pads 9 include a source terminal pad 2 and a ground terminal pad 4. A source line 1a is guided from the source terminal pad 2 to the circuit unit 5. Similarly, a ground line 3a is extended from the ground terminal pad 4 to the circuit unit 5.

Both the source line 1a and the ground line 3a are connected to the circuit unit 5 after routed inside of the terminal pads 9 so that each line is, for example, twice or more as long as the shortest route.

Figure 5:
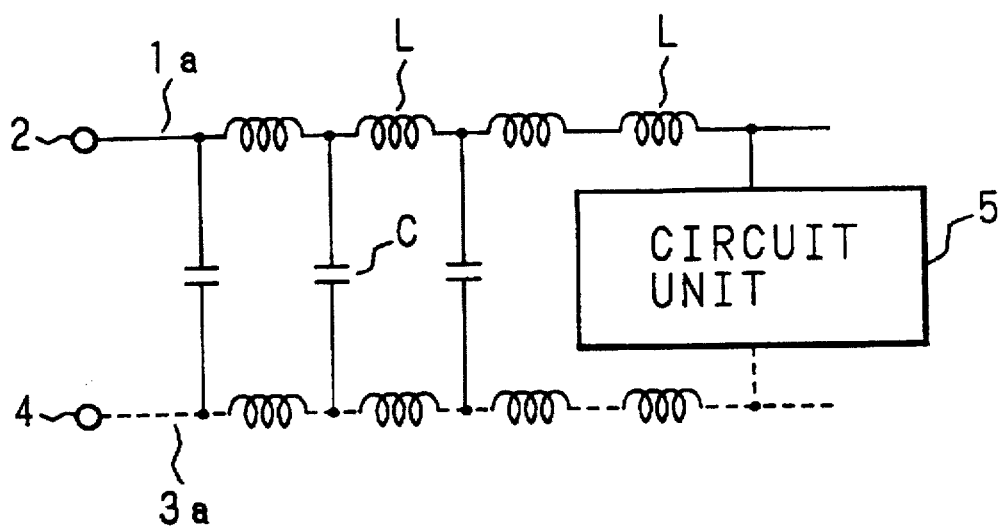
FIG. 5 is an equivalent circuit diagram of the semiconductor integrated circuit device of FIG. 4.

FIG. 5 is an equivalent circuit diagram of the semiconductor integrated circuit device, in which a capacity C at a bar of the ladder circuit and each inductance L of the source line 1a and ground line 3a at both sides of the capacity C constitute an LC filter. The circuit unit 5 is connected between the source line 1a and ground line 3a.

In the above constitution of the semiconductor integrated circuit device, large inductances L and large capacities C are parasitic on the source line 1a and ground line 3a to form the LC filter. Therefore, even if noises of power cannot be fully absorbed by a bypass capacitor, the noises are absorbed by the source line 1a and ground line 3a.

An absorption amount, namely, an attenuation amount of noises is calculated in the following manner in one example. The inductance and capacity of the source line 1a are illustrated equivalently in FIG. 3.

Figure 1:
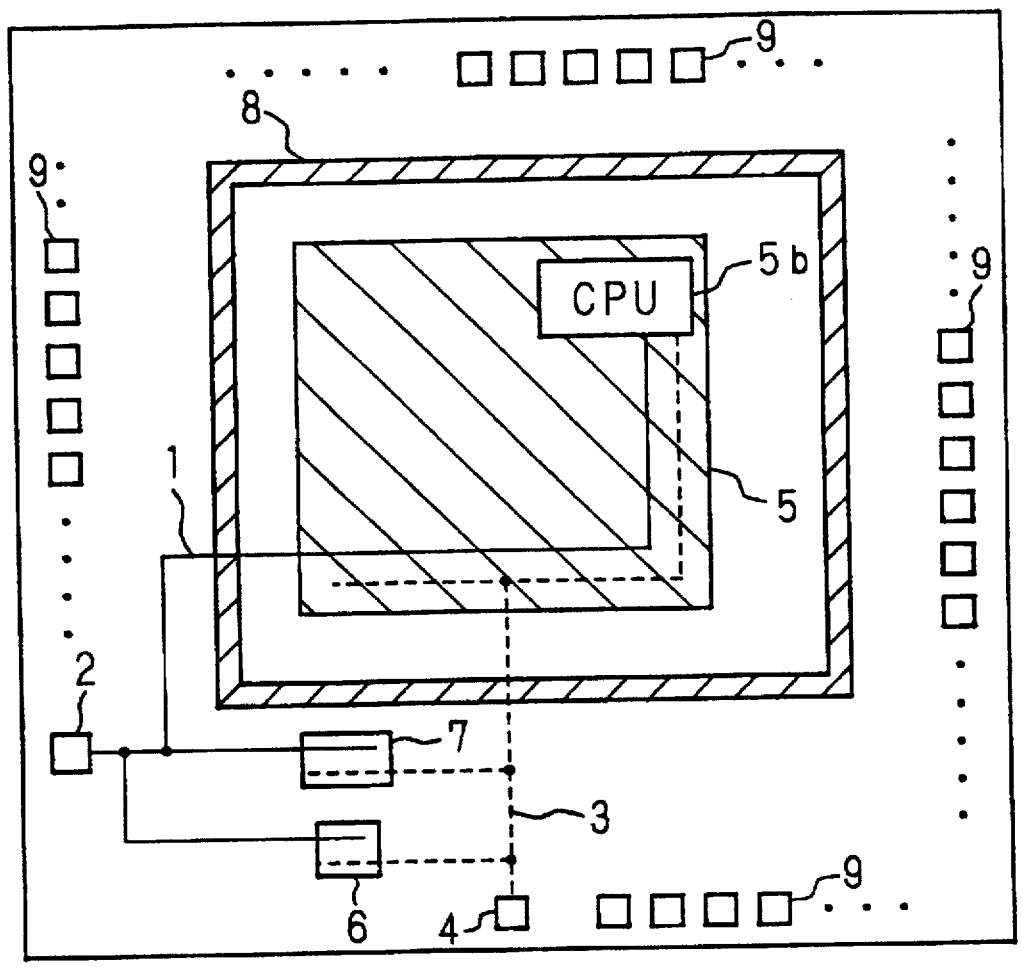
FIG. 1 is a diagram showing the configuration of a conventional semiconductor integrated circuit device.
Figure 2:
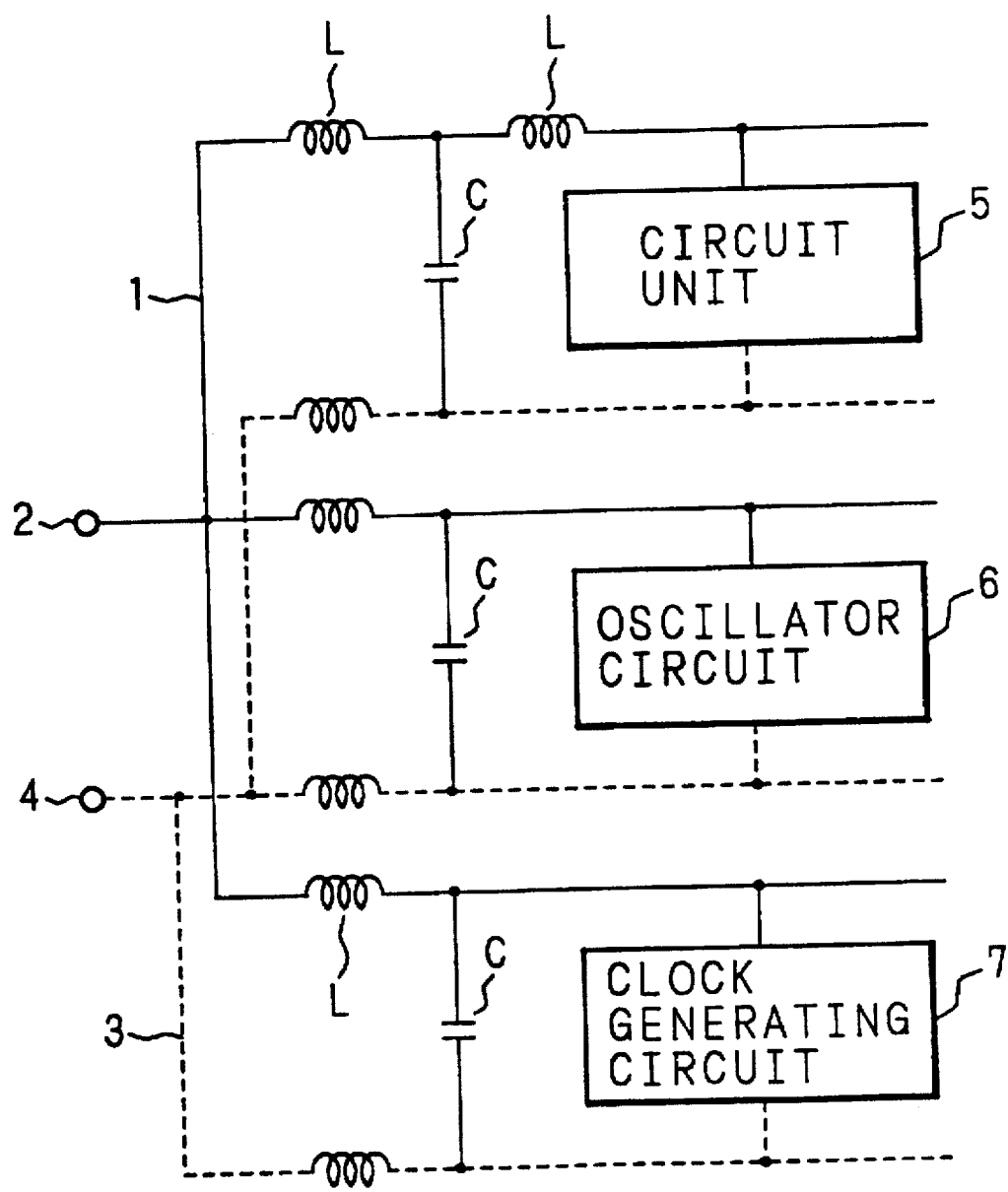
FIG. 2 is an equivalent circuit diagram of the semiconductor integrated circuit device of FIG. 1.
Figure 3:
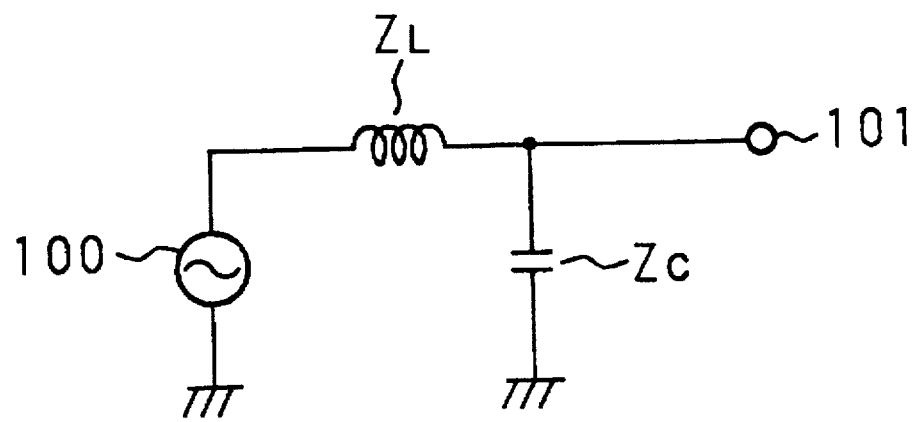
FIG. 3 is a circuit diagram equivalently showing an inductance and a capacity added to a source line.

The inductance and capacity added to the source line 1 in FIG. 3 are represented by an impedance $Z_L$ of inductance components which is connected in series to the noise generation source 100 having the other end grounded, and an impedance $Z_C$ of capacity components which is connected in parallel to the noise generation source 100 and impedance $Z_L$, with the other end grounded. The inductance and capacity constitute a circuit equivalent to an LC filter in which a connection point between the impedances $Z_L$ and $Z_C$ serves as an output terminal 101.

For instance, when the source line 1a is routed 3 mm, supposing that under the presence of an inductance of 30 nH, a capacity of 200 pF is applied to the source line 1a and the noise generation source has 100 MHz, impedances $Z_L$ and $Z_C$ hold:

$$Z_L = 2\pi f L = 2\pi \times 100 \times 10^6 \times 30 \times 10^{-9} \approx 18.8 (\Omega)$$

$$Z_C = 1/2\pi f C = 1/(2\pi \times 100 \times 10^6 \times 200 \times 10^{-12}) \approx 7.96 (\Omega)$$

The attenuation amount is accordingly $Z_C/(Z_C + Z_L) \approx 0.3$.

Embodiment 2

Figure 6:
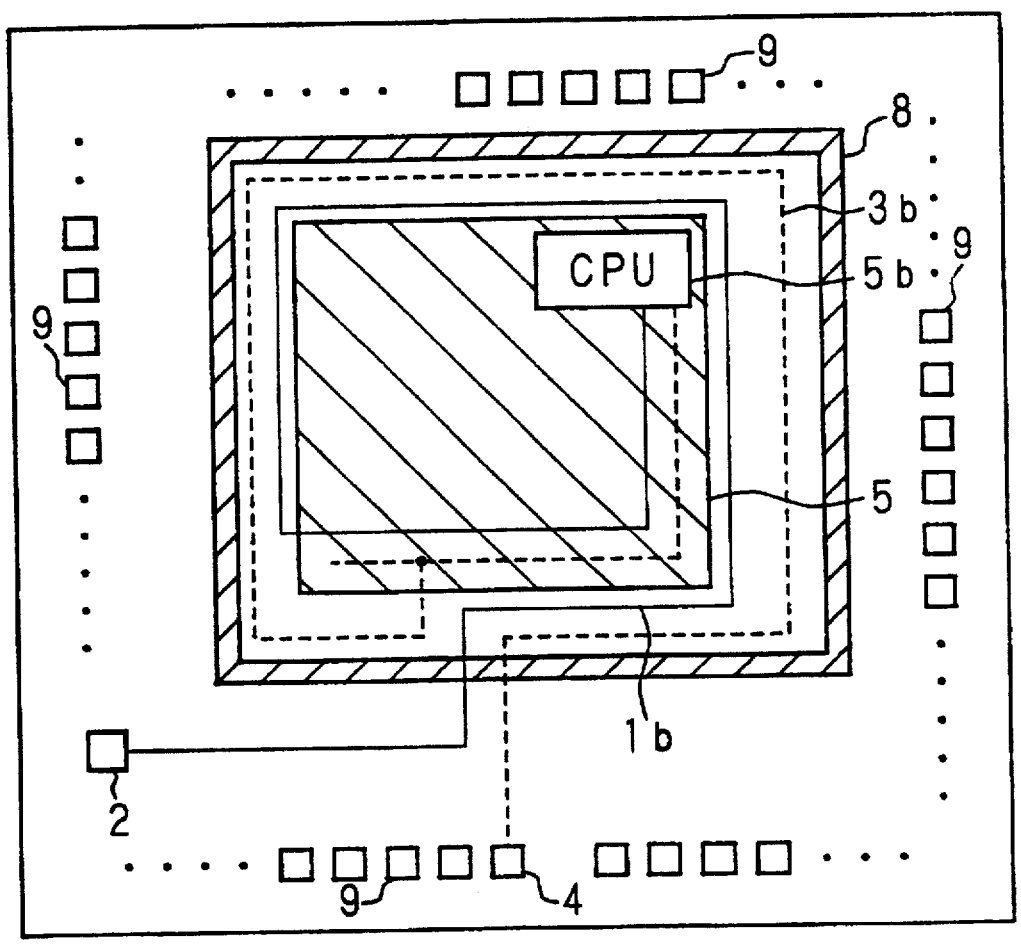
FIG. 6 is a diagram of the configuration of a semiconductor integrated circuit device according to a second embodiment of the invention.

FIG. 6 is a diagram of the configuration of a semiconductor integrated circuit device according to a second embodiment of the invention. A source line 1b is connected from a source terminal pad 2 to a circuit unit 5. A ground line 3b is started from a ground terminal pad 4 to the circuit unit 5. The source line 1b and ground line 3b are, after routed, for example, a quarter turn or more in the periphery of the circuit unit 5, led to the circuit unit 5. The constitution of the second embodiment is equal in other points to that of the first embodiment and depicted with the same reference numerals, the description of which will be omitted here. An equivalent circuit of the semiconductor integrated circuit device of the second embodiment is the same as in FIG. 5.

Large inductances L and large capacities C are parasitic on the source line 1b and ground line 3b, thereby constituting an LC filter in the semiconductor integrated circuit device. Even when noises of power cannot be absorbed sufficiently by a bypass capacitor, the source line 1b and ground line 3b work to absorb the noises. An absorption amount of noises, i.e., an attenuation amount of noises is detected in the same manner as in the foregoing first embodiment, and therefore the description will be abbreviated.

Embodiment 3

Figure 7:
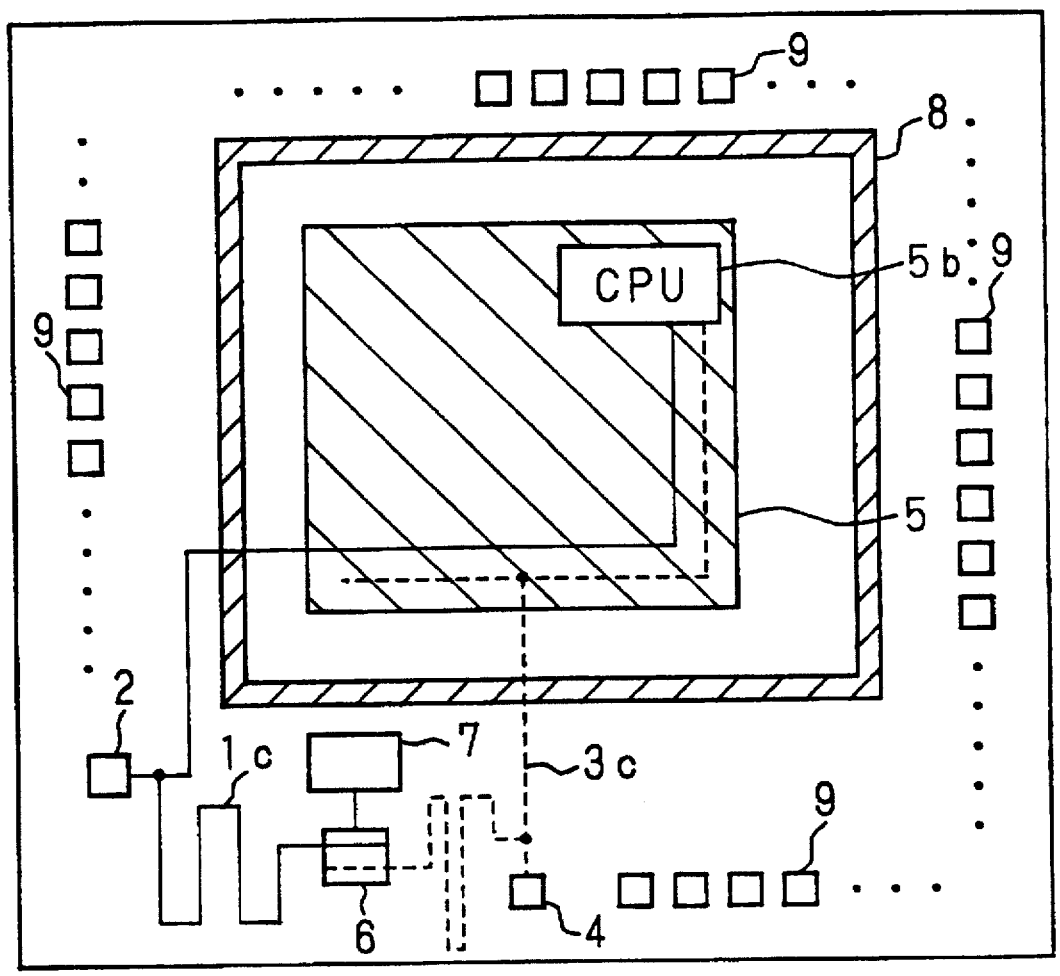
FIG. 7 is a diagram of the configuration of a semiconductor integrated circuit device according to a third embodiment of the invention.

FIG. 7 is a diagram of the configuration of a semiconductor integrated circuit device of a third embodiment of the invention. The device is provided with a circuit unit 5 including a CPU 5b, a bus 8 such as a data bus, an address bus, etc. arranged in a manner to surround the circuit unit 5, terminal pads 9 arranged outside the bus 8, an oscillator circuit 6 for generating pulses, and a clock generating circuit 7 for generating system clocks from the pulses from the oscillator circuit 6. The terminal pads 9 include a source terminal pad 2 and a ground terminal pad 4. A source line 1c is connected from the source terminal pad 2 to the circuit unit 5, oscillator circuit 6 and clock generating circuit 7. From the ground terminal pad 4 is connected a ground line 3c to the circuit unit 5, oscillator circuit 6 and clock generating circuit 7 (The source line 1c and ground line 3c to the clock generating circuit 7 are not shown in FIG. 7.). The source line 1c and ground line 3c are led to the oscillator circuit 6 after being routed to be, for example, twice or more a length of the shortest route.

Figure 8:
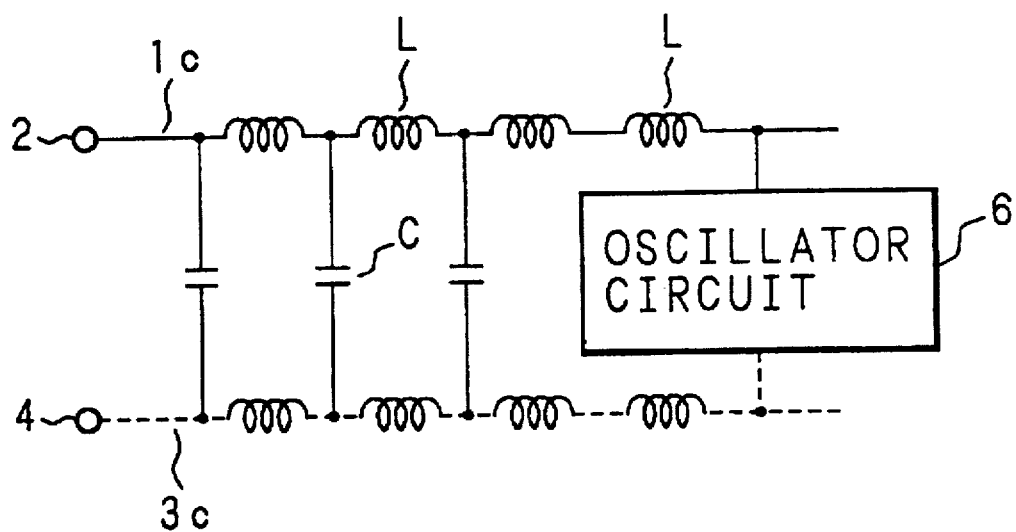
FIG. 8 is an equivalent circuit diagram of an oscillator circuit in the semiconductor integrated circuit device of FIG. 7.

FIG. 8 is an equivalent circuit diagram of the oscillator circuit 6 of the semiconductor integrated circuit device. Capacities C at lateral bars of the ladder circuit and inductances L of the source line 1c and ground line 3c at both sides of the capacities C form an LC filter in the equivalent circuit. The oscillator circuit 6 is connected between the source line 1c and ground line 3c.

Large inductances L and large capacities C parasitic on the source line 1c and ground line 3c form the LC filter in the semiconductor integrated circuit device. Therefore, even when noises of power and noises by a feedthrough current of a CMOS transistor constituting the oscillator circuit 6 are not fully absorbed by a bypass capacitor, the source line 1c and ground line 3c absorb the noises. An absorption amount, that is, an attenuation amount of noises is obtained in the same way as in the first embodiment, the description of which will be abbreviated.

Embodiment 4

Figure 9:
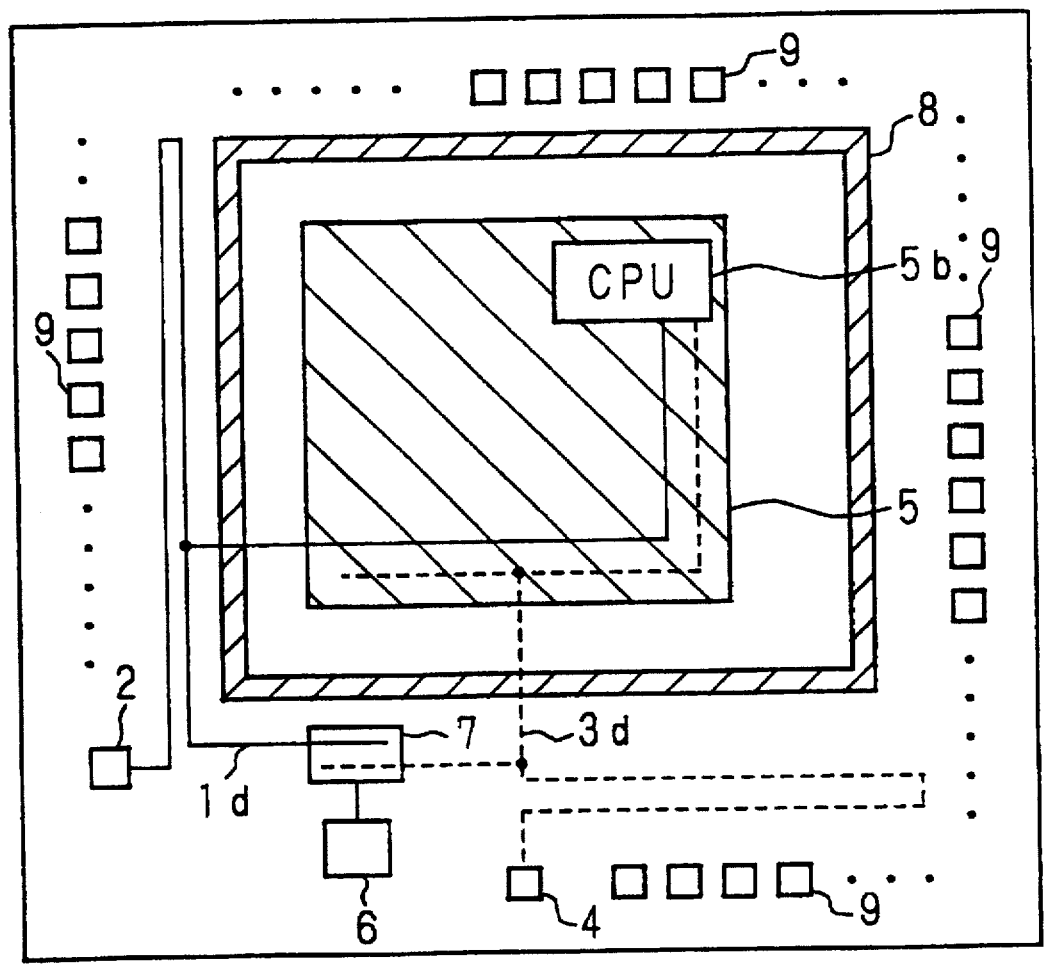
FIG. 9 is a diagram of the configuration of a semiconductor integrated circuit device according to a fourth embodiment of the invention.

FIG. 9 is a diagram of the configuration of a semiconductor integrated circuit device in accordance with a fourth embodiment of the invention. There are provided in the semiconductor integrated circuit device a circuit unit 5 including a CPU 5b, a bus 8, namely, a data bus, an address bus, etc. surrounding the circuit unit 5, terminal pads 9 arranged outside the bus 8, an oscillator circuit 6 for generating pulses, and a clock generating circuit 7 for forming system clocks from the pulses generated in the oscillator circuit 6. The terminal pads 9 include a source terminal pad 2 and a ground terminal pad 4. A source line 1d is led from the source terminal pad 2 to the circuit unit 5, oscillator circuit 6 and clock generating circuit 7, while a ground line 3d is led from the ground terminal pad 4 to the circuit unit 5, oscillator circuit 6 and clock generating circuit 7 (The source line 1d and ground line 3d to the oscillator circuit 6 are not shown in FIG. 9.). After the source line 1d and ground line 3d are routed at an inner side of the terminal pads 9 to be not smaller than twice a length of the shortest route, both lines 1d and 3d are introduced to the circuit unit 5 and clock generating circuit 7.

Figure 10:
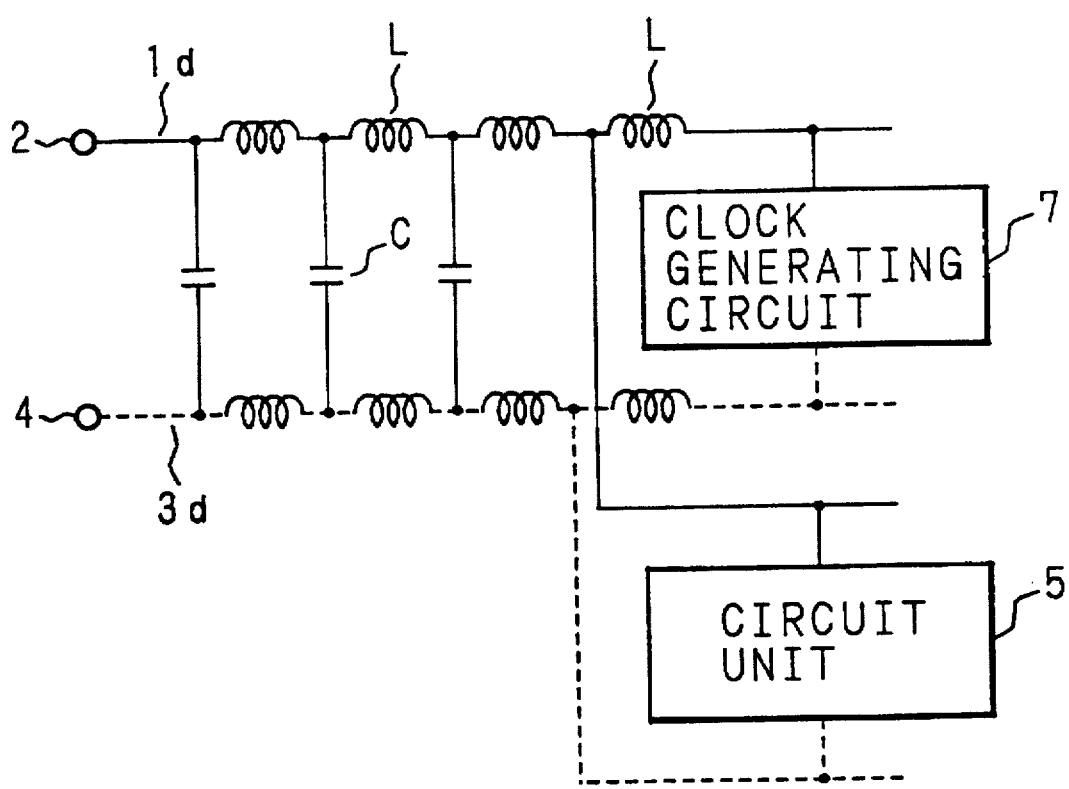
FIG. 10 is an equivalent circuit diagram of a circuit including a circuit unit and a clock generating circuit of the semiconductor integrated circuit device of FIG. 9.

FIG. 10 represents an equivalent circuit diagram of the circuit unit 5 and clock generating circuit 7 of the semiconductor integrated circuit device of FIG. 9. In the equivalent circuit, a capacity C at a bar of the ladder circuit and each inductance L of the source line 1d and ground line 3d at both sides of the capacity C constitute an LC filter. The circuit unit 5 and clock generating circuit 7 are connected in parallel to the LC filter.

In the semiconductor integrated circuit device, the large inductances L and capacities C parasitic on the source line 1d and ground line 3d form the LC filter. Owing to the thus-constituted LC filter, even if noises of power and noises by a feedthrough current of a CMOS transistor forming the clock generating circuit 7 cannot be sufficiently absorbed by a bypass capacitor, the source line 1d and ground line 3d are effective to absorb the noises. An absorption amount of noises, that is, attenuation amount of noises is calculated in the same manner as in the above first embodiment, the description of which will be abbreviated.

Embodiment 5

Figure 11:
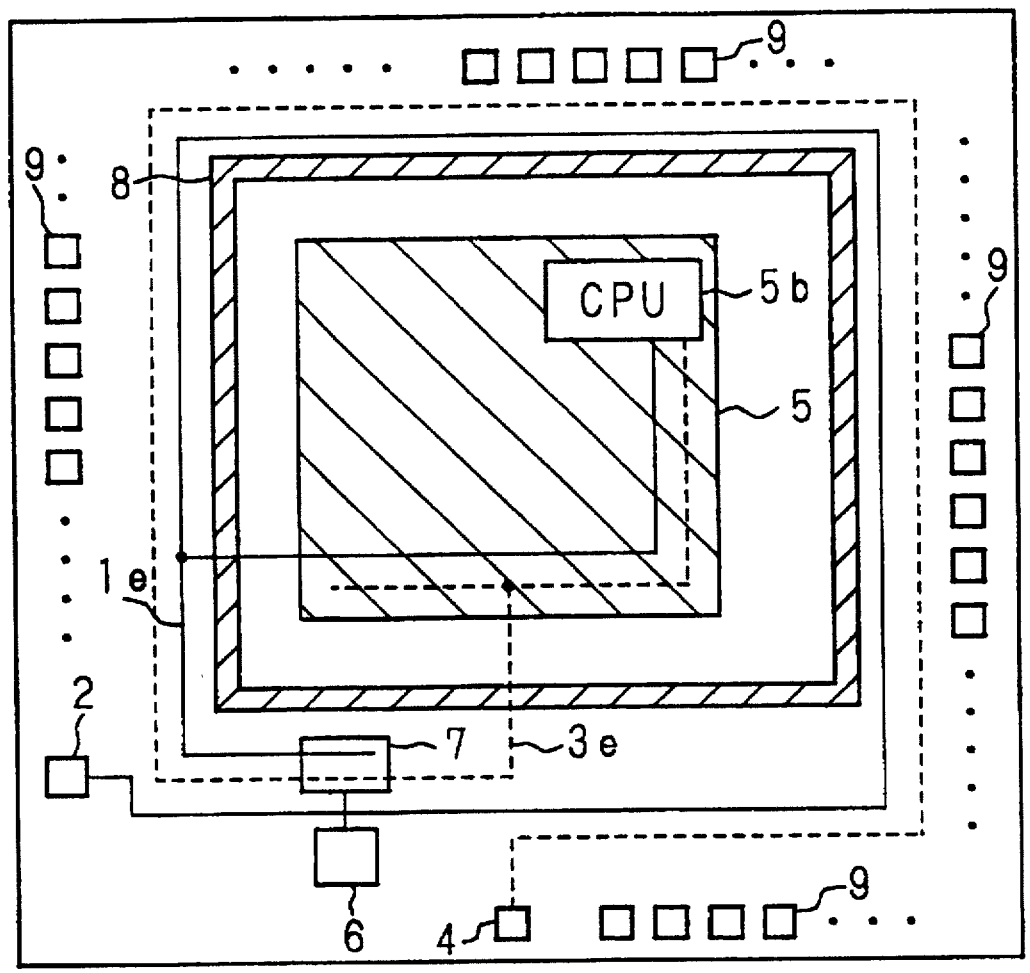
FIG. 11 is a diagram of the configuration of a semiconductor integrated circuit device according to a fifth embodiment of the invention.

The configuration of a semiconductor integrated circuit device according to a fifth embodiment of the invention is indicated in a diagram of FIG. 11. Terminal pads 9 include a source terminal pad 2 and a ground terminal pad 4. A source line 1e is connected from the source terminal pad 2 to each of a circuit unit 5, an oscillator circuit 6 and a clock generating circuit 7, while a ground line 3e runs from the ground terminal pad 4 to the circuit unit 5, oscillator circuit 6 and clock generating circuit 7 (The source line 1e and ground line 3e to the oscillator circuit 6 are not shown in FIG. 11.).

Each of the source line 1e and ground line 3e is guided to the circuit unit 5 and clock generating circuit 7 after being routed, for instance, not smaller than a quarter turn in the periphery of the circuit unit 5. The constitution of the fifth embodiment is the same in other points as that of the fourth embodiment, and the description of the other points with the same reference numerals will be abbreviated here. An equivalent circuit to the circuit unit 5 and clock generating circuit 7 of the semiconductor integrated circuit device is the same as shown in FIG. 10.

Because of large inductances L and capacities C parasitic on the source line 1e and ground line 3e, an LC filter is formed in the semiconductor integrated circuit device. Therefore, even if noises of power and noises by a feedthrough current of a CMOS transistor constituting the clock generating circuit 7 cannot be absorbed fully by a bypass capacitor, the source line 1e and ground line 3e absorb the noises. An absorption amount of noises, namely, attenuation amount of noises is obtained in the same manner as in the first embodiment depicted earlier, the description of which will be abbreviated.

Embodiment 6

Figure 12:
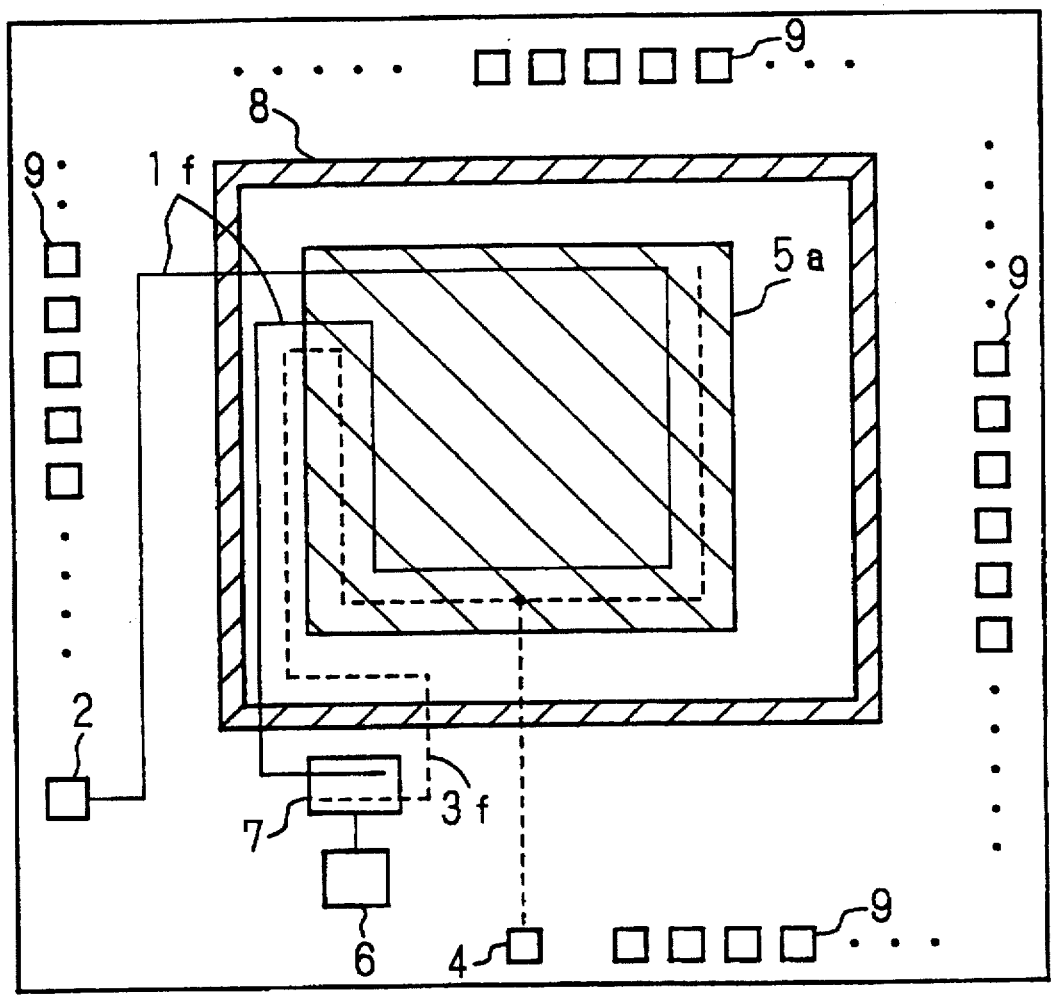
FIG. 12 is a diagram of the configuration of a semiconductor integrated circuit device according to a sixth embodiment of the invention.

The configuration of a semiconductor integrated circuit device of a sixth embodiment of the invention is shown in FIG. 12. The semiconductor integrated circuit device of FIG. 12 is provided with a circuit unit 5a including a CPU, a bus 8 such as a data bus, an address bus and the like wired to surround the circuit unit 5a, terminal pads 9 which are arranged outside the bus 8 and which include a source terminal pad 2 and a ground terminal pad 4, an oscillator circuit 6 for generating pulses and, a clock generating circuit 7 for generating system clocks from the pulses of the oscillator circuit 6.

A power source line 1f is started and connected from the source terminal pad 2 to the circuit unit 5a, oscillator circuit 6 and clock generating circuit 7. Meanwhile, a ground line 3f is wired from the ground terminal pad 4 to the circuit unit 5a, oscillator circuit 6 and clock generating circuit 7 (The source line 1f and ground line 3f to the oscillator circuit 6 are not shown in the drawing.). The source line 1f and ground line 3f are introduced into the clock generating circuit 7 after passing the interior of the circuit unit 5a.

Figure 13:
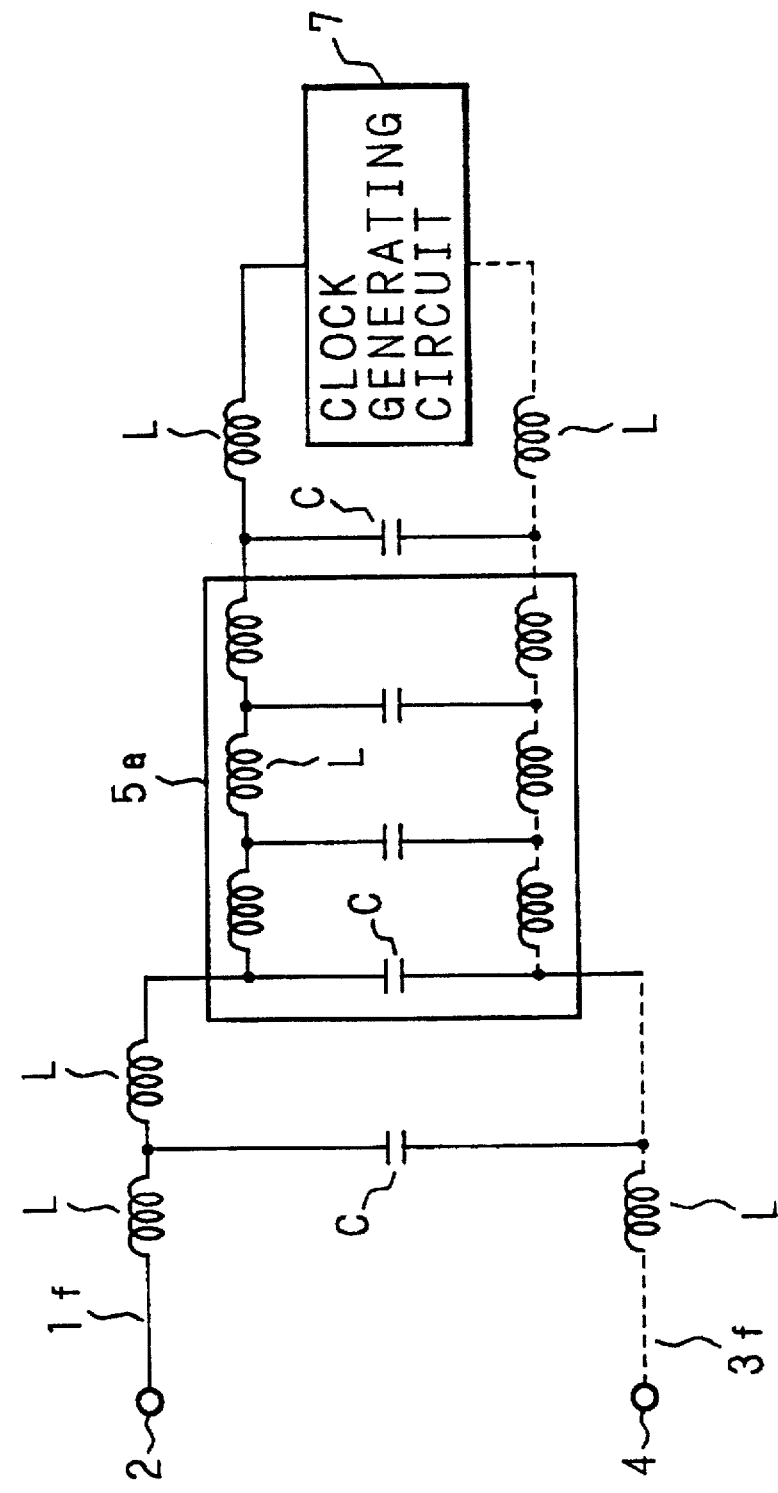
FIG. 13 is an equivalent circuit diagram of a circuit including a circuit unit and a clock generating circuit of the semiconductor integrated circuit device of FIG. 12.

FIG. 13 is a circuit diagram equivalent to the circuit unit 5a and clock generating circuit 7 of the semiconductor integrated circuit device. A capacity C at a bar of the ladder circuit and an inductance L of each of the source line 1f and ground line 3f at both sides of the capacity C arranged in the equivalent circuit constitutes an LC filter. A part of the LC filter where the source line 1f and ground line 3f pass through the circuit unit 5a is included in the circuit unit 5a. The clock generating circuit 7 is connected at end parts of the source line 1f and ground line 3f.

In the semiconductor integrated circuit device of the above-described constitution, large inductances L and capacities C are parasitic on the source line 1f and ground line 3f thereby to form an LC filter. Consequently even if noises of power and noises by a feedthrough current of a CMOS transistor constituting the clock generating circuit 7 cannot be absorbed fully by a bypass capacitor, the noises are absorbed by the source line 1f and ground line 3f. An absorption amount, i.e., attenuation amount of noises in this case is obtained according to the same equation as in the first embodiment, and the description thereof will be omitted here.

Embodiment 7

Figure 14:
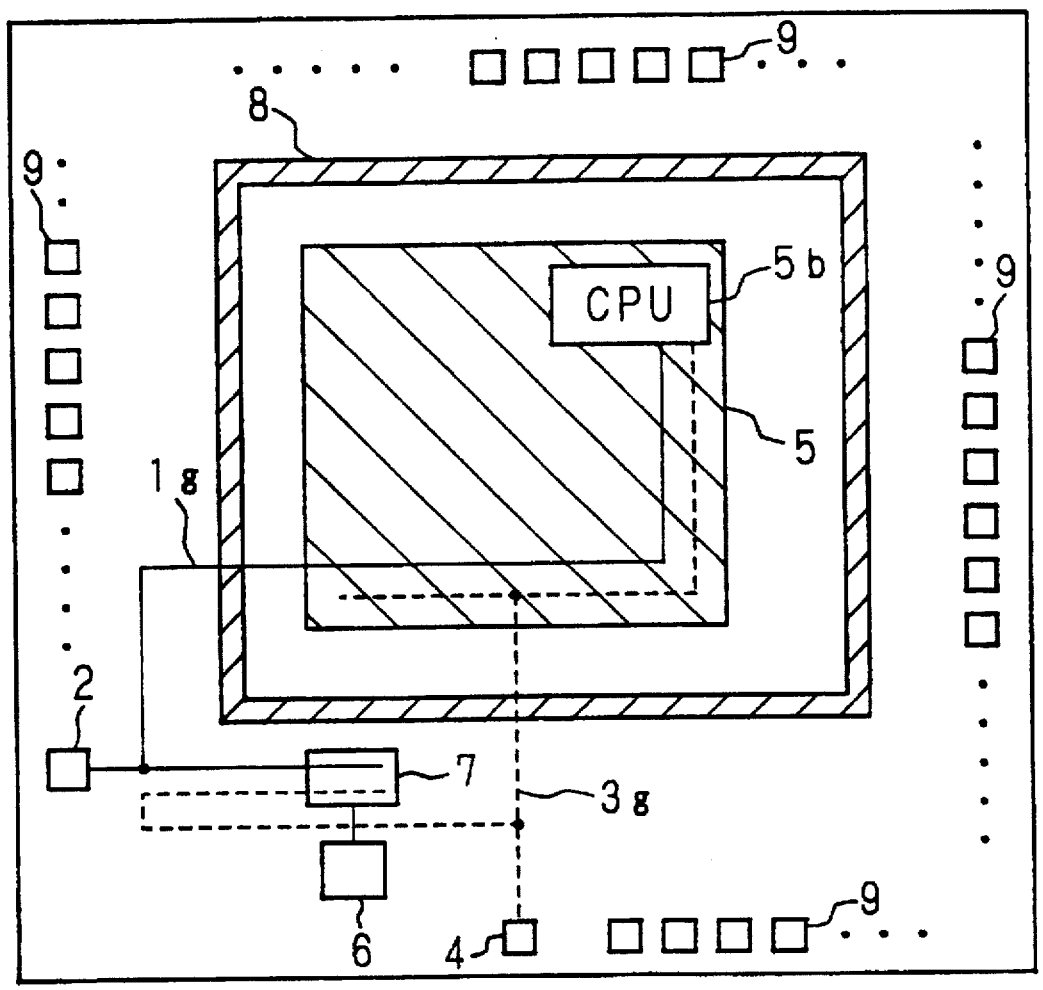
FIG. 14 is a diagram of the configuration of a semiconductor integrated circuit device according to a seventh embodiment of the invention.

FIG. 14 is a diagram showing the configuration of a semiconductor integrated circuit device of a seventh embodiment of the invention. Terminal pads 9 include a source terminal pad 2 and a ground terminal pad 4. A source line 1g and a ground line 3g are connected respectively from the source terminal pad 2 and ground terminal pad 4 to a circuit unit 5, an oscillator circuit 6 and a clock generating circuit (The source line 1g and ground line 3g to the oscillator circuit 6 are not shown in FIG. 14.). The source line 1g and ground line 3g are guided to the clock generating circuit 7 in a state, for instance, where a part of the ground line 3g, specifically, not smaller than ½ the total length of the ground line 3g to the clock generating circuit 7 is adjacent and parallel to the source line 1g. The constitution in other points of the semiconductor integrated circuit device of the embodiment is the same as in the fourth embodiment, and the description thereof will be abbreviated here.

A current runs from the source line 1g to the ground line 3g via the clock generating circuit 7 in the seventh embodiment. Moreover, the source line 1g is made adjacent and parallel to the ground line 3g, whereas the current flows in opposite directions in the lines 1g and 3g. As a result of this, a mutual inductance of the source line 1g and ground line 3g is in inverse proportion to a distance between the source line 1g and ground line 3g and proportional to a distance of a section where the lines 1g and 3g are parallel to each other.

The mutual inductance is increased when the distance between the lines 1g and 3g is reduced and the parallel section is lengthened, which can be added to the inductances of the source line and ground line (mainly self inductances) in each of the foregoing embodiments. Therefore, the LC filter of the source line 1g and ground line 3g is so effective in this semiconductor integrated circuit device that the electromagnetic interferences are dealt to be solved more efficiently than in the above-discussed embodiments.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor integrated circuit device, comprising:

a circuit unit including a CPU;

a bus wired to surround said circuit unit;

terminal pads arranged outside said bus;

an oscillator circuit for generating pulses;

a clock generating circuit responsive to the pulses generated by said oscillator circuit for generating system clocks;

a first fixed potential line running from a terminal pad of a first fixed potential to said clock generating circuit; and a second fixed potential line running from a second terminal pad of a second fixed potential to said clock generating circuit, wherein said first fixed potential line is connected to said clock generating circuit, while a part equal to or larger than ½ a total length of one of said first and second fixed potential lines is adjacent to and in parallel with the other line.

2. A semiconductor integrated circuit device, comprising:

a circuit unit including a CPU;

a bus wired to surround said circuit unit;

terminal pads arranged outside said bus; and a fixed potential line running from a terminal pad of a fixed potential to said circuit unit and having a part extended to increase a parasitic inductance thereof, wherein the length of said fixed potential line is at least twice as long as the shortest route between said terminal pad of the fixed potential and said circuit unit.

3. A semiconductor integrated circuit device, comprising:

a circuit unit including a CPU;

a bus wired to surround said circuit unit;

terminal pads arranged outside said bus;

an oscillator circuit for generating pulses;

a clock generating circuit responsive to the pulses generated by said oscillator circuit for generating system clocks; and a fixed potential line running from a terminal pad of a fixed potential to said oscillator circuit, and having a part extended to increase a parasitic inductance thereof;

wherein the length of said fixed potential line is at least twice as long as the shortest route between said terminal pad of the fixed potential and said oscillator circuit.

4. A semiconductor integrated circuit device, comprising:

a circuit unit including a CPU;

a bus wired to surround said circuit unit;

terminal pads arranged outside said bus;

an oscillator circuit for generating pulses;

a clock generating circuit responsive to the pulses generated by said oscillator circuit for generating system clocks; and a fixed potential line running from a terminal pad of a fixed potential to said clock generating circuit and having a part extended to increase a parasitic inductance thereof;

wherein the length of said fixed potential line is at least twice as long as the shortest route between said terminal pad of the fixed potential and said clock generating circuit.

5. A semiconductor integrated circuit device according to claim 2, wherein said fixed potential line is extended along the external periphery of said circuit unit.

6. A semiconductor integrated circuit device according to claim 3, wherein said fixed potential line is extended along the external periphery of said circuit unit.

7. A semiconductor integrated circuit device according to claim 4, wherein said fixed potential line is extended along the external periphery of said circuit unit.

8. A semiconductor integrated circuit device according to claim 5, wherein said fixed potential line is extended to have a length more than a quarter round of said circuit unit in the periphery of said circuit unit.

9. A semiconductor integrated circuit device according to claim 6, wherein said fixed potential line is extended to have a length more than a quarter turn round of said circuit unit in the periphery of said circuit unit.

10. A semiconductor integrated circuit device according to claim 7, wherein said fixed potential line is extended to have a length more than a quarter round of said circuit unit in the periphery of said circuit unit.

* * * * *